US006839873B1

(12) United States Patent
Moore (10) Patent No.: US 6,839,873 B1
(45) Date of Patent: Jan. 4, 2005

(54) METHOD AND APPARATUS FOR PROGRAMMABLE LOGIC DEVICE (PLD) BUILT-IN-SELF-TEST (BIST)

(75) Inventor: Michael T. Moore, Santa Clara, CA (US)

(73) Assignee: Cypress Semiconductor Corporation, San Jose, CA (US)

( * ) Notice: Subject to any disclaimer, the term of this patent is extended or adjusted under 35 U.S.C. 154(b) by 606 days.

(21) Appl. No.: 09/602,938

(22) Filed: Jun. 23, 2000

(51) Int. Cl.$^7$ ............................................. G01R 31/28
(52) U.S. Cl. ........................... 714/725; 326/39; 326/38; 716/16
(58) Field of Search ................................ 714/724–725; 326/39–41; 365/191; 716/16–7

(56) References Cited

U.S. PATENT DOCUMENTS

| | | | | |
|---|---|---|---|---|
| 4,771,399 A | * | 9/1988 | Snowden et al. | 365/226 |
| 5,032,533 A | * | 7/1991 | Gill et al. | 438/263 |
| 5,652,886 A | * | 7/1997 | Tulpule et al. | 713/2 |
| 5,668,816 A | * | 9/1997 | Douskey et al. | 714/720 |
| 5,702,988 A | * | 12/1997 | Liang | 438/238 |
| 5,759,877 A | * | 6/1998 | Crafts et al. | 438/132 |
| 5,878,051 A | * | 3/1999 | Sharma et al. | 714/724 |
| 5,889,701 A | * | 3/1999 | Kang et al. | 365/185.18 |
| 5,909,587 A | * | 6/1999 | Tran | 712/1 |
| 5,946,267 A | * | 8/1999 | Pathak et al. | 365/233 |
| 5,970,005 A | * | 10/1999 | Yin et al. | 365/201 |
| 5,991,907 A | * | 11/1999 | Stroud et al. | 714/725 |
| 6,003,150 A | * | 12/1999 | Stroud et al. | 714/725 |
| 6,044,025 A | * | 3/2000 | Lawman | 365/191 |
| 6,046,957 A | * | 4/2000 | Shyu | 365/230.06 |
| 6,154,864 A | * | 11/2000 | Merritt | 714/738 |
| 6,202,182 B1 | * | 3/2001 | Abramovici et al. | 714/725 |
| 6,260,139 B1 | * | 7/2001 | Alfke | 713/1 |
| 6,401,160 B1 | * | 6/2002 | See et al. | 711/5 |
| 6,538,468 B1 | * | 3/2003 | Moore | 326/40 |
| 6,539,510 B1 | * | 3/2003 | St. Pierre et al. | 714/727 |
| 6,631,487 B1 | * | 10/2003 | Abramovici et al. | 714/725 |
| 2002/0073372 A1 | * | 6/2002 | Slezak et al. | 714/734 |

OTHER PUBLICATIONS

Cook, A First Course in Digital Electronics, Prentice–Hall 1999, p. 684–689.*
Virtex 2.5 V: Field Programmable Gate Array, Datasheet DS003, Xilinx, 23 May 23, 2000, version 2.2.*
4 Mbit Virtual SPROM, Applicant Note XAPP079, Xilinx, Sep. 1997, version 2.2.*
Dynamic Reconfiguration, Application Note XAPP 093, Xilinx, Nov. 10, 1997, Version 1.1.*

* cited by examiner

*Primary Examiner*—Guy J. Lamarre
(74) *Attorney, Agent, or Firm*—Bradley T. Sako (57) ABSTRACT

According to one embodiment, a programmable logic assembly (200) may include a nonvolatile memory (202) may be coupled to an associated volatile programmable logic device (PLD) (204). Built-in-self-test (BIST) data (208) may be stored in a nonvolatile memory (202) that places the volatile PLD (204) in a self-test configuration. If a volatile PLD (204) passes a self-test, user data (210) may be stored in a nonvolatile memory (202) that places a volatile PLD (204) into a user determined configuration.

20 Claims, 8 Drawing Sheets

METHOD AND APPARATUS FOR PROGRAMMABLE LOGIC DEVICE (PLD) BUILT-IN-SELF-TEST (BIST)

TECHNICAL FIELD

The present invention relates generally to programmable logic devices (PLDs), and more particularly to built-in-self-tests for PLDs.

BACKGROUND OF THE INVENTION

Programmable logic has increasingly become a valued resource for system designers. Programmable logic can allow for a custom logic design to be implemented without the initial cost, delay and complexity of designing and fabricating an application specific integrated circuit (ASIC).

Currently, there are many variations of programmable logic, including simple programmable logic devices (SPLDs), complex PLDs (CPLDs), and field programmable gate arrays (FPGAs). Such devices typically include programmable logic circuits that operate in conjunction with corresponding memory circuits. The particular function of a logic circuit can be determined according to data stored in a corresponding memory circuit. Some programmable logic arrangements can include switching circuits (also called programmable interconnects) that can enable and/or disable switching paths according to data stored in a memory circuit. A memory circuit is typically a nonvolatile memory circuit, such as a programmable read-only-memory (PROM), an electrically programmable ROM (EPROM), and/or electrically erasable and programmable ROM (EEPROM), including "flash" EEPROMs.

A nonvolatile memory circuit can be formed on a different integrated circuit than programmable logic. That is, a programmable logic circuit die can receive configuration information from an associated nonvolatile memory circuit that may be on the same die or a separate die.

In addition to the above basic structure, programmable logic arrangements may have alternate structures. For example, while a system may include a separate programmable logic device and an EEPROM memory circuit, some processes may be capable of forming nonvolatile devices and conventional volatile devices on the same integrated circuit. In such a case, the nonvolatile memory circuit is "on-chip" (or integrated) with a volatile programmable logic circuit.

To configure programmable logic, a memory circuit within the device can be programmed with data values that give the desired functionality. In some arrangements, data can be loaded in a compressed form. The programmable logic may then include a decompression algorithm for decompressing an incoming data bit stream as it is stored within a memory circuit.

Like other integrated circuit devices, the manufacture of programmable logic can include a "front-end" and a "back-end." The front end of programmable logic manufacturing may include the fabrication of devices on a wafer. The back-end may include slicing wafers into dice, packaging the dice, and testing the resulting packages. With the increasing complexity of programmable devices, testing can become an important step in a manufacturing process.

Back-end testing may include a range of possible tests. For example, at one end of the spectrum, such tests can be basic, checking for opens and shorts in the logic circuits of a programmable logic device. At the other end of the spectrum, such tests can check the particular operation of the logic circuits, including operational speed. Such test can allow non-failing devices to be categorized (binned) according their operating characteristics (e.g., speed).

In some arrangements, a tester can be loaded with a test program that exercises various functions of a programmable logic device. Such an approach can be time consuming as a tester must apply various input signals and wait for the resulting input signals. In addition, between different devices and/or different tests, test program data may have to be loaded into the tester.

One way to address the complexity, cost and delay in testing programmable logic has been to include self-test circuitry on the device itself. Such approaches have been referred to as "built-in-self-test" (BIST). Programmable logic with BIST capabilities can reduce test times. Instead of having a tester exercise various tests, such tests can be run on the chip itself, which is typically much faster. Programmable logic with BIST capabilities can further reduce the burden on a tester. Instead of having a tester sequence through various functions, a tester may only have to read a pass or fail indication. Consequently, simpler, less expensive testers can be used.

A drawback to conventional programmable logic BIST has been the resulting area that BIST circuits require. Such additional area can increase the overall size the resulting devices, increasing manufacturing costs. In particularly, a typical BIST approach can include numerous multiplexer circuits formed in the logic circuits that provide certain signal paths in a "normal" mode and different signal paths in a test mode. In addition, BIST circuits may include additional logic gates for logically combining various output signals to generate a test result. In addition to increasing overall area, the incorporation of such "hard" logic circuits into the existing logic circuits can add complexity to the design, complicating circuit layout and routing. Added complexity arises out of the need to include such hard logic BIST circuits without adversely affecting normal mode signal propagation times.

To better understand the operation of the various embodiments of the present invention, the operation of a conventional programmable logic device with BIST capabilities will now be described.

Figure 8A:
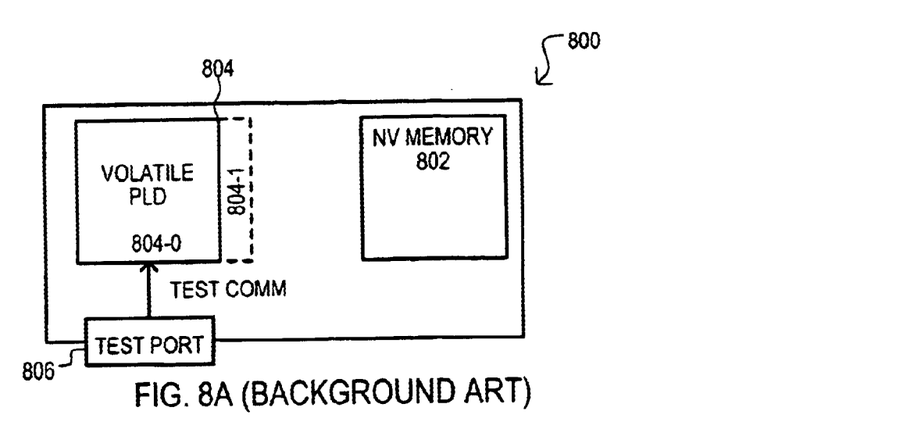
FIGS. 8A to 8C are block diagrams illustrating the operation of a conventional programmable logic device.

Referring now to FIG. 8A, a programmable logic assembly 800 is shown that includes a nonvolatile memory 802, a volatile programmable logic device (PLD) 804, and a test port 806. As noted above, a conventional volatile PLD 804 can include area dedicated to normal logic circuits 804-0 and area dedicated to BIST circuits 804-1. Of course, the areas 804-0 and 804-1 are conceptual representations, as BIST circuits are typically intermixed within the normal logic circuits. Areas 804-0 and 804-1 are provided to illustrate how conventional BIST approaches can result in larger integrated circuit areas.

FIG. 8A shows the initiation of a self-test operation for a programmable logic device 800. A volatile PLD 804 can receive a self-test command. Such a command could be initiated in a variety of ways, including but not limited to, a particular combination of input values, an "overvoltage" applied to one or more particular pins, and/or upon power-up of the device. A self-test command may be issued by a number of sources. As but of few of the many possible examples, a self-test mode may be initiated by a tester machine, a user, and/or by a system in which a PLD is a part.

Figure 8B:
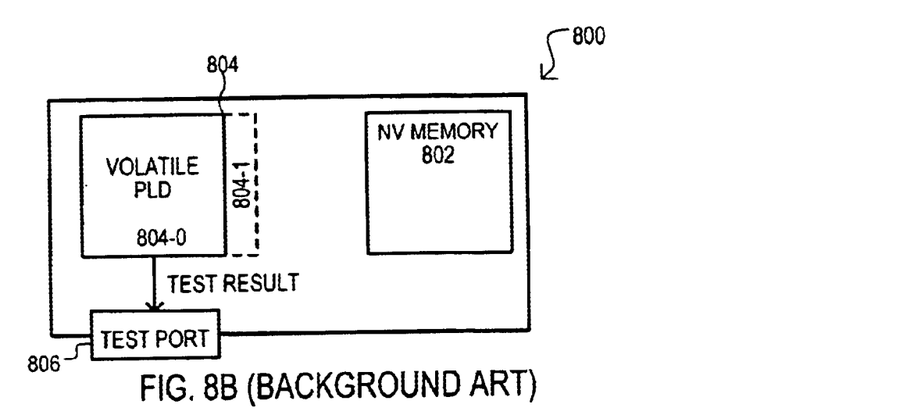

FIG. 8B shows a self-test operation result. A volatile PLD 804 can execute a self-test operation with internal BIST hard logic and generate one or more self-test results. In the particular example of FIG. 8B, a self-test result may be output by way of test port 806. A self-test result could be provided to a tester machine, to a user, or to a system, as but a few examples.

Figure 8C:
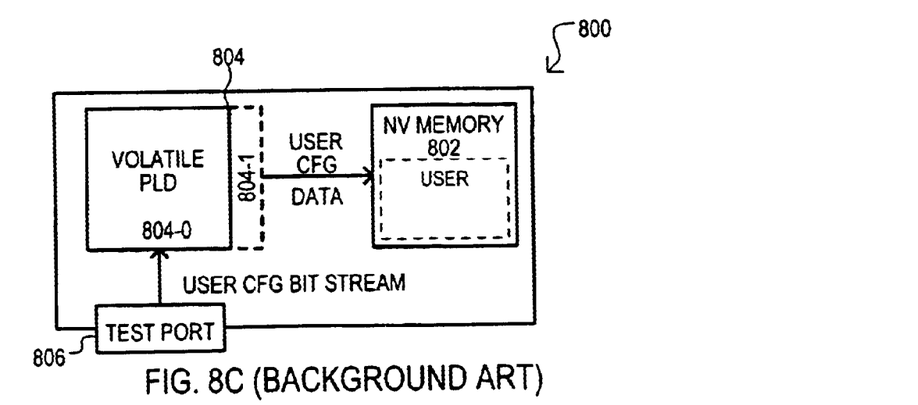

In the event a self-test result indicates that a PLD 804 is functioning properly, the programmable logic device 804 may be configured as desired by a user. FIG. 8C shows a conventional programming operation. Configuration data may be entered that can establish a user-defined functionality for the PLD 804. In particular, configuration data may be entered by a user through test port 806 and programmed into a nonvolatile memory 802. In one particular arrangement, configuration data can be entered in a compressed data stream. A PLD 804 may include hardware for decompressing such a data stream.

While a conventional assembly 800 such as that shown in FIGS. 8A to 8C can provide BIST functionality, it comes at the cost of increased circuit area on a PLD 804.

In light of the above discussion, if would desirable to arrive at some way of implementing self-test on a programmable logic device that does not result in undue increases in the area dedicated to built-in-self-test circuits.

It would be desirable to arrive at some way of implementing self-test on a programmable logic device that can be more economical than conventional approaches.

It would also be desirable to arrive at a way of testing programmable logic devices that does not necessarily require complex tester machines and/or programs.

SUMMARY OF THE INVENTION

The present invention includes a programmable logic assembly that may provide self-test capabilities in a compact package. A programmable logic assembly may include a volatile programmable logic device (PLD) and a nonvolatile memory that stores configuration data for the volatile PLD. A nonvolatile memory may be programmed with self-test configuration data that enables the volatile PLD to perform a self-test. If a volatile PLD passes a self-test, user configuration data may then be programmed into the nonvolatile memory.

According to one aspect of the embodiments, a volatile PLD and a nonvolatile memory may be formed on separate integrated circuit dice.

According to another aspect of the embodiments, a volatile PLD and a nonvolatile memory may be formed on the same integrated circuit die.

According to another aspect of the embodiments, one nonvolatile memory on the same die as the volatile PLD may store self-test configuration data, while another nonvolatile memory may store user configuration data.

According to another aspect of the embodiments, self-test configuration data may be stored on a mask programmable read-only-memory integrated with the volatile PLD. User configuration data can be stored on a different nonvolatile memory.

According to another aspect of the embodiments, self-test configuration data may be stored on a particular sector of a nonvolatile memory. User configuration data may be stored in a different sector of the nonvolatile memory.

According to another aspect of the embodiments, a self-test may be executed when power is applied to the assembly.

DETAILED DESCRIPTION OF THE EMBODIMENTS

Various embodiments will now be described in conjunction with a number of diagrams. The embodiments set forth a programmable logic assembly that may include a volatile programmable logic device (PLD) that can provide a particular function according to configuration data. Built-in-self-test (BIST) data for a volatile PLD can be stored in a nonvolatile memory. The BIST data can enable a self-test of a volatile PLD circuit. In particular arrangements, when power is first applied to a programmable logic assembly, BIST data is supplied to a volatile PLD to execute a self-test. Once the self-test is complete, a nonvolatile memory may be programmed with user configuration data.

Figure 1:
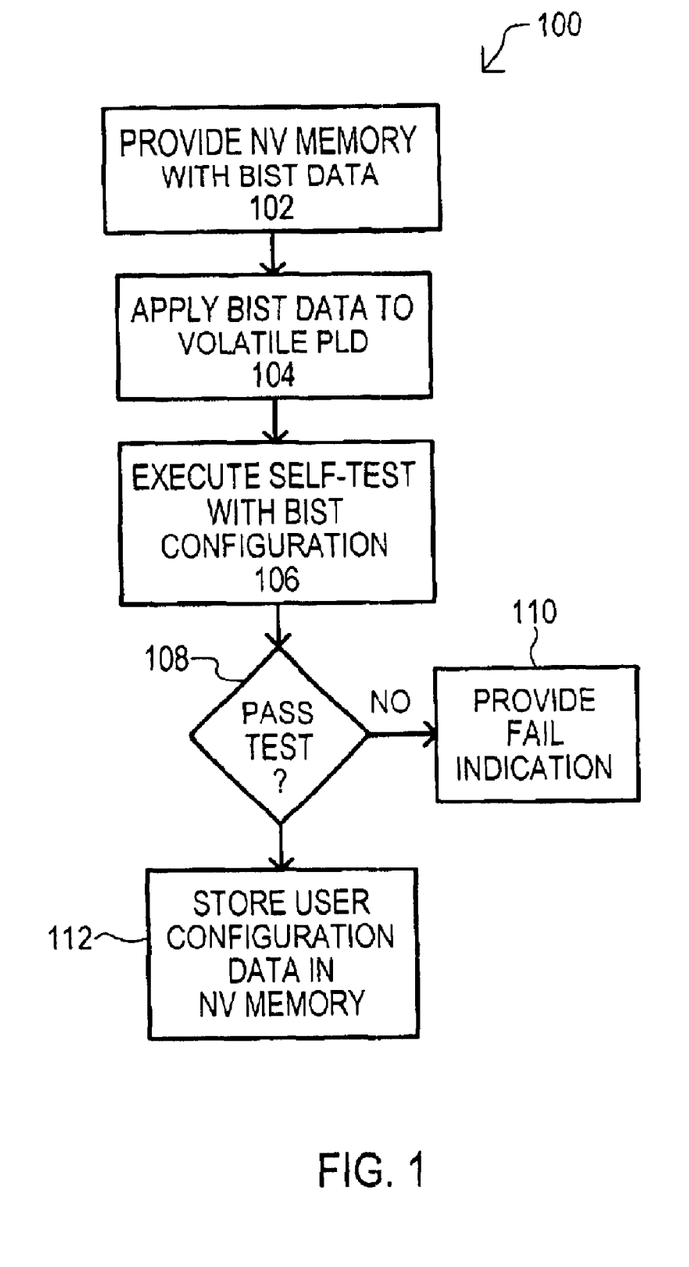
FIG. 1 is a diagram illustrating a method of operating a programmable logic device according to the present invention.

Referring now to FIG. 1, the general operation of an embodiment is set forth in a flow diagram 100. A step 102 may include providing a nonvolatile memory that stores BIST data. BIST data may be configuration data for a PLD that enables the PLD to execute a self-test. A step 104 may include applying BIST data to an associated volatile PLD, thereby placing the volatile PLD into a self-test configuration.

Once in a self-test configuration, a volatile PLD may execute a self-test operation (step 106) and either pass or fail the self-test (step 108). As shown in FIG. 1, if a self-test is failed, a fail indication may be provided (step 110). If, however, a self-test is passed, user data for configuring the tested volatile PLD can be entered. In particular, user configuration data can be stored into a nonvolatile memory (step 112).

Figure 2A:
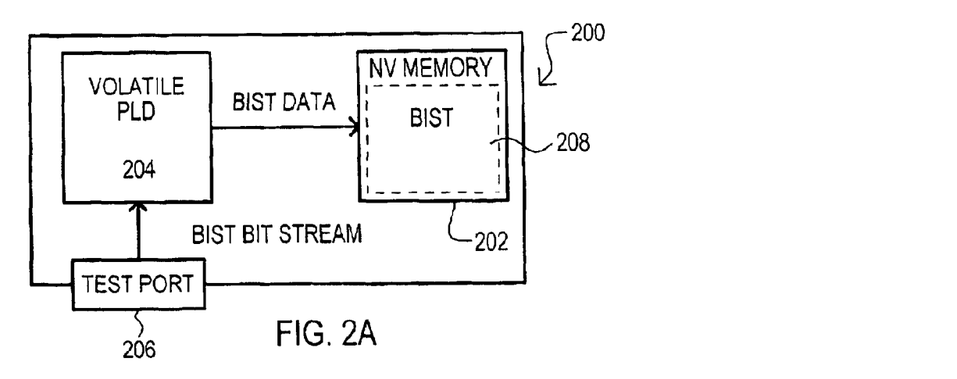
FIGS. 2A to 2C are block diagrams showing a programmable logic device according to a first embodiment.
Figure 2B:
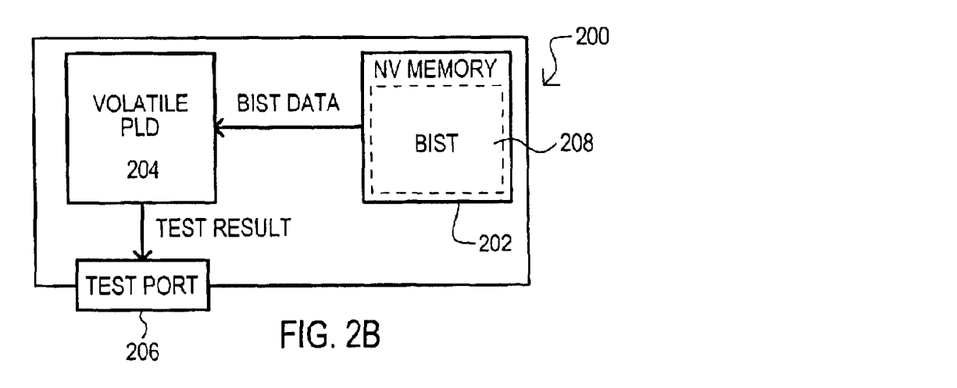
Figure 2C:
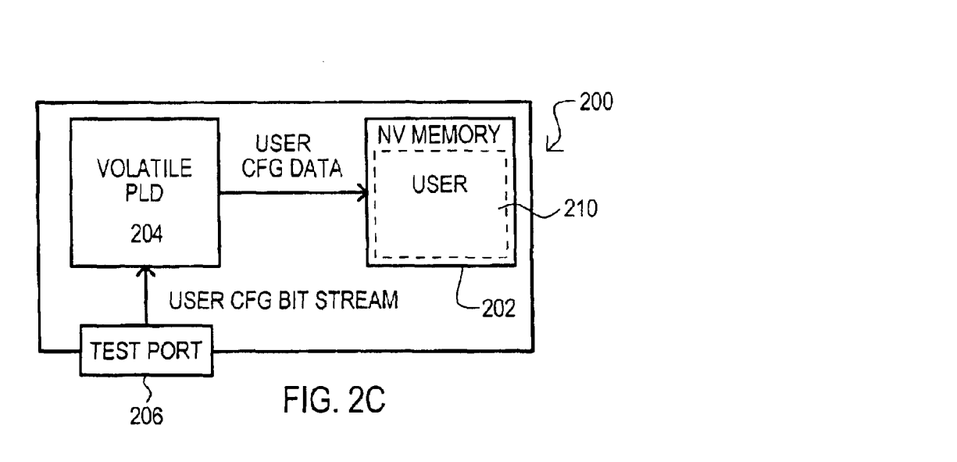
Figure 3:
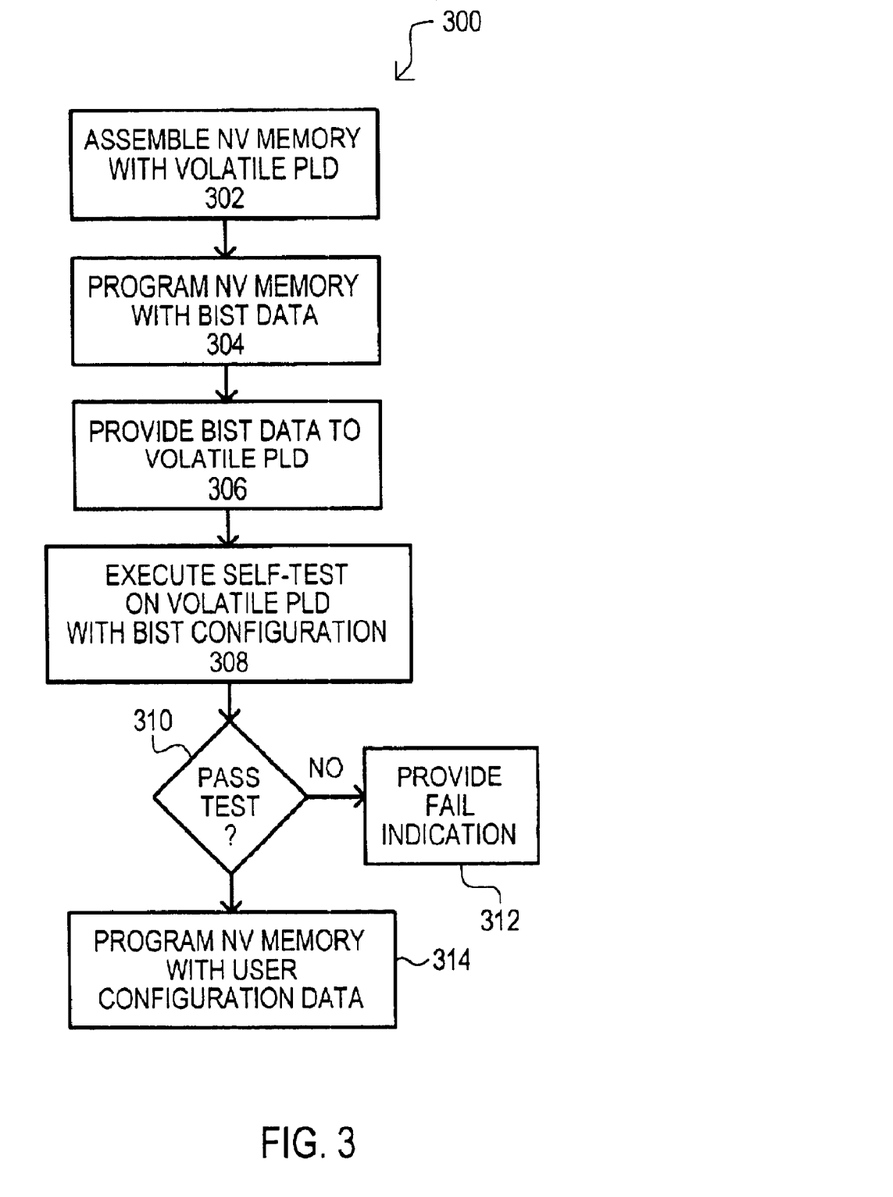
FIG. 3 is a diagram illustrating the operation of the first embodiment.

Referring now to FIGS. 2A to 2C and 3, a first embodiment of the present invention will now be described. FIG. 3 is a flow diagram describing a method of testing a PLD according to a first embodiment. FIGS. 2A to 2C are a sequence of block diagrams corresponding to the method illustrated in FIG. 3.

As shown in FIG. 3, a method 300 may include providing an assembly that includes a nonvolatile memory and volatile PLD (step 302). FIG. 2A shows an assembly 200 that includes a nonvolatile memory 202, a volatile PLD 204, and a test port 206. In one particular arrangement, a nonvolatile memory 202 may include an electrically erasable and programmable read-only-memory (EEPROM), such as a "flash" EEPROM. In addition, a volatile PLD 204 may be formed on a different integrated circuit die than a nonvolatile memory 202. As but a two of the many possible arrangements, a volatile PLD 204 and nonvolatile memory 202 may be different dice assembled in the same package (e.g., multi-chip module, or the like). Alternatively, a volatile PLD 204 and nonvolatile memory 202 may be in different packages on the same circuit board.

A method 300 may further include programming a nonvolatile memory with BIST data (step 304). As in the case of the embodiment of FIG. 1, BIST data in a nonvolatile memory can place a corresponding volatile PLD 204 into a self-test configuration. In the example illustrated by FIG. 2A, BIST data can be initially loaded into a programmable logic device 200 in a compressed form (a BIST bit stream). Compressed BIST data may then be decompressed by a volatile PLD 204. Such an arrangement can allow BIST data to be entered in a relatively fast fashion. A volatile PLD 204 may already include algorithms for decompressing the received BIST data stream, as such algorithms can be used to decompress conventional configuration data provided by a user.

Alternate approaches to programming BIST data may be possible. As but one example, in the event a volatile PLD 204 and a nonvolatile memory 202 are separately packaged, a nonvolatile memory 202 could be loaded with BIST data before being incorporated into an assembly 200. As another example, BIST data may be programmed directly from a port, such as a test port 206, rather than through a volatile PLD 204.

Referring once again to FIG. 3, BIST data programmed into a nonvolatile memory may be provided to a corresponding volatile PLD (step 306). FIG. 2B shows stored BIST data being provided to a volatile programmable logic device 204. BIST data can place a volatile PLD 204 into a self-test configuration. Once in a self-test configuration, a self-test can be performed by a volatile PLD 204 (step 308). In response to such a self-test, a volatile PLD 204 can generate a test result.

Such a self-test may be executed at various points in the manufacturing process. For example, an assembly 200 may be created and then tested with a BIST function. In another example, an assembly 200 may be shipped to a user, and the user may test the assembly 200 using the BIST function of the invention. Of course, a built-in-self-test may include any of the various range of self-tests previously described (i.e., as simple as a test for opens and shorts, or more complex tests, such as functionality tests and also parametric or performance tests that can rate the device for speed).

A self-test result can ease the burden on a tester machine, as a tester machine may only have to read a test result, rather than apply various test vectors and commands. In one particular arrangement, a test port may be a JTAG (Joint Test Action Group) port that is compliant with the IEEE 1149.1 standard. Consequently, a volatile PLD 204 may include a JTAG architecture, including boundary scan registers and controller. In such an arrangement, self-test results may be shifted out according to conventional boundary scan techniques.

In other approaches a self-test may be initiated by other conventional means, including but not limited to, entering particular commands, applying one or more overvoltage signals, or when power is first an assembly 300.

It is noted that while FIG. 2B shows BIST data being provided from a nonvolatile memory 202 to a volatile PLD 204 of the same assembly 200, a nonvolatile memory 202 could provide BIST data to other devices. As but one example, a system may include a "separate" volatile PLD that may not include an associated nonvolatile memory. In such a case, BIST data from a nonvolatile memory 202 in an assembly 200 can be provided to such a separate volatile PLD placing it in a self-test mode. In addition, BIST data could be provided from a nonvolatile memory 202 in an assembly 200 to another nonvolatile memory.

As shown by step 310, if a volatile PLD does not pass a self-test, it can provide a fail indication or the like (step 312). However, if a PLD passes all self-tests, the PLD may then be used in a conventional fashion. More particularly, a nonvolatile memory 302 may be programmed with user configuration data (step 314) which may overwrite some or all of the BIST data. Of course, such an operation may include an initial erase operation followed by a program operation that supplies configuration data to a nonvolatile memory 202. Further, as in the case of BIST data, user configuration data may be programmed directly into a nonvolatile memory 202, instead of through a volatile PLD 204.

By pre-loading BIST data into a nonvolatile memory 202 of an assembly 200, self-tests can be performed on a volatile PLD 204 which may reduce or eliminate the need for hard logic circuits on a PLD that are present in conventional approaches. In this way, built-in-self-test capabilities can be provided without substantially increasing the size of a programmable logic device assembly.

Figure 4A:
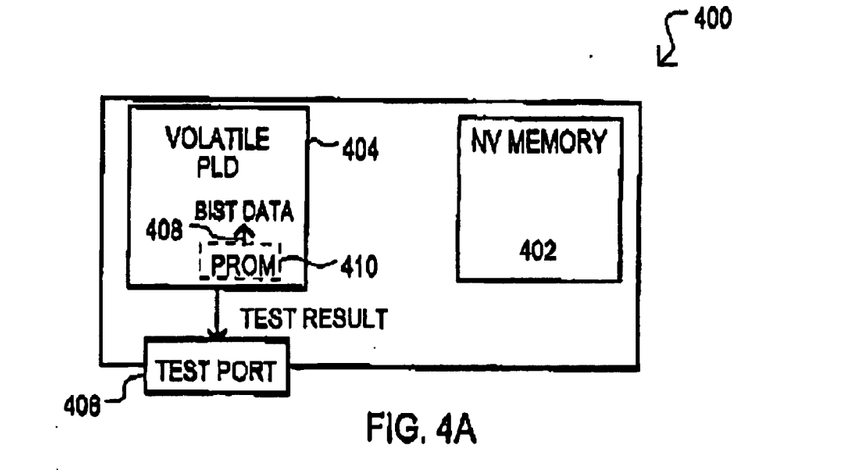
FIGS. 4A and 4B are block diagrams showing a programmable logic device according to a second embodiment.
Figure 4B:
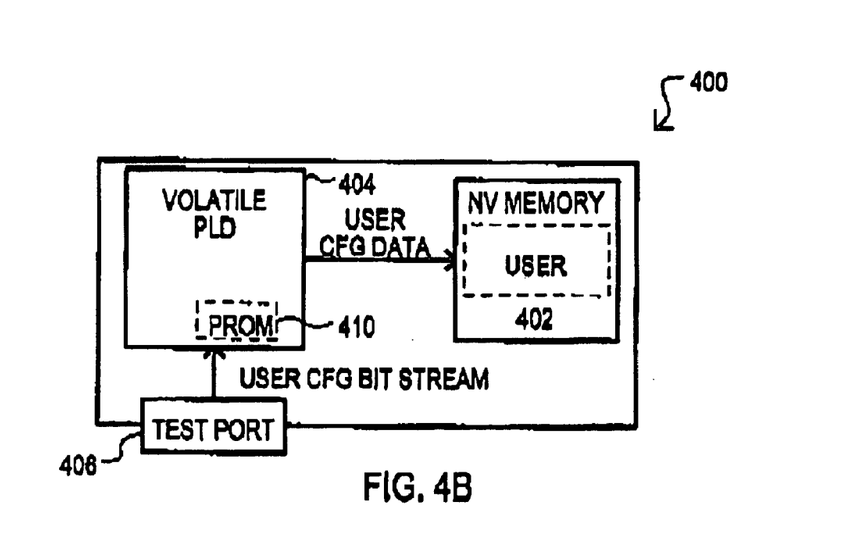
Figure 5:
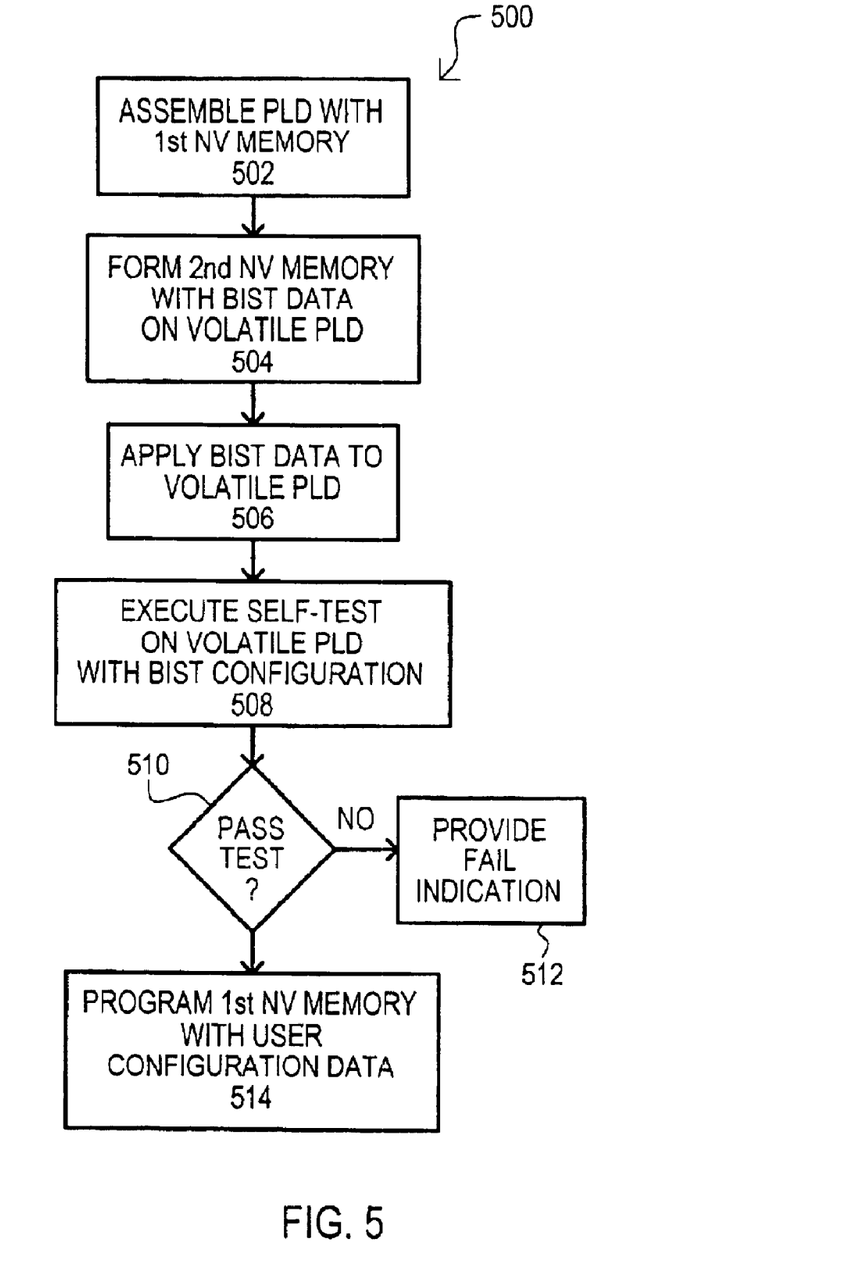
FIG. 5 is a diagram illustrating the operation of the second embodiment.

While BIST data may be programmed into a nonvolatile memory device, such data may be established at an earlier point in the manufacturing process, resulting in BIST data that may be stored in a more permanent fashion. Such an arrangement is illustrated in a second embodiment shown in FIGS. 4A, 4B and 5. FIG. 5 is a flow diagram describing a method of testing a PLD according to a second embodiment. FIGS. 4A and 4B are diagrams corresponding to the method illustrated in FIG. 5.

As shown in FIG. 5, a method 500 may include forming a nonvolatile memory with BIST data on a volatile PLD (step 502). Referring now to FIGS. 4A and 4B, an assembly 400 according to a second embodiment may include a first nonvolatile memory 402, a volatile PLD 404, and test port 406. Unlike the first embodiment assembly 200 of FIGS. 2A to 2C, in a second embodiment 400, BIST data 408 may be stored in a second nonvolatile memory 410 that can be different from the first nonvolatile memory 402.

In one particular arrangement, a second nonvolatile memory 410 may be a mask programmable ROM formed on the same die as a PLD 404. That is, a second nonvolatile memory 410 may be integrated with a PLD 404. In one particular configuration, a PLD 404 may include a mask programmable ROM as a second nonvolatile memory device 410. A mask PROM may be programmed in a manufacturing step when a PLD 404 is initially formed. In many instances, a mask PROM may require less area than other nonvolatile memories, such as EEPROMs, including flash EEPROMs. Further, mask PROMs may be more easily implemented into an existing manufacturing process for volatile logic circuits, such those included in volatile PLD 404.

FIG. 4A shows stored BIST data stored in a second nonvolatile memory 410 being provided to the volatile PLD 404 in which it is formed. Such an operation can place a PLD 404 in a self-test configuration. As in the case of the first embodiment 200, a self-test may then be performed that can carry out any of a number of the self-tests previously described. In one approach, BIST data stored in a second nonvolatile memory 410 may be automatically loaded upon power-up of the assembly 400 or PLD 404.

Once BIST data from second nonvolatile memory 410 is loaded, a volatile PLD 404 may be placed in a self-test configuration, and a self-test may be executed (step 508). FIG. 4A shows a volatile PLD 404 providing a test result in response to a self-test.

As noted in conjunction with FIG. 2B, BIST data could also be provided from a second nonvolatile memory 410 to a different volatile PLD or another nonvolatile memory (not shown).

As in the case of a first embodiment, if a volatile PLD does not pass a self-test, it can provide a fail indication or the like (step 512). However, if a volatile PLD passes all self-tests, the PLD may then be configured in the same general fashion as the second embodiment previously described. More particularly, a first nonvolatile 402 may be programmed with user configuration data. This user configuration data may then be provided to a volatile PLD 404. Further, as noted in conjunction with FIG. 2C, a first nonvolatile memory 402 may be programmed by way of volatile PLD 402 and/or directly by way of a port, such as test port 406.

By storing BIST data in a second nonvolatile memory 410, an assembly 400 according to a second embodiment can provide BIST capabilities with relatively small increases in die size with respect to conventional approaches that include hard logic for BIST capabilities. In this way, built-in-self-test capabilities can be provided without substantially increasing the size of a programmable logic device.

It is further noted that using a mask PROM as a second nonvolatile memory 402 can allow BIST data 408 to be available at all times. Thus, self-test may be performed on a volatile PLD whenever desired. In addition, or alternatively, the speed of various reliability tests, such as burn-in or other cycling test can be improved. If functional tests are required following various reliability stages, BIST data to initiate a test mode after each stage can always be available.

Still further, while the above description indicates that BIST data 408 may be loaded upon power-up, such an operation could also be initiated by other means described in conjunction with the first embodiment (e.g., entry of a particular command, overvoltage at one or more pins, etc.). Of course one test may be initiated at power-up while one or more different tests could be initiated subsequently.

Including BIST data in an on-chip mask PROM can result in faster overall back-end throughput than the first embodiment. In the first embodiment, BIST data would have to be programmed in a nonvolatile memory. In contrast, in the second embodiment, BIST data is present without having to include a programming step.

Referring now to FIGS. 6A to 6C and FIG. 2, a block diagram shows an assembly 600 according to a third embodiment. An assembly 600 may include a device having both a volatile circuit elements and nonvolatile circuit elements. Such a device will be referred to herein as a mixed volatile/nonvolatile device 602. Within a mixed volatile/nonvolatile device 602, volatile circuit elements may form a programmable logic device while nonvolatile circuit elements may include storage circuits that can store user programmed configuration data. Volatile circuit elements may further provide a particular function based upon the stored user configuration data.

Figure 6A:
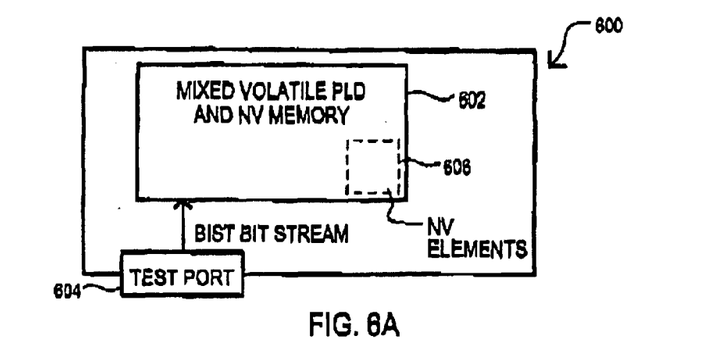
FIGS. 6A to 6C are block diagrams showing a programmable logic device according to a third embodiment.
Figure 6B:
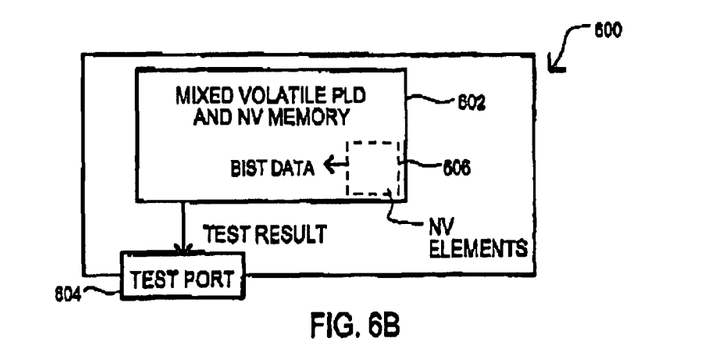
Figure 6C:
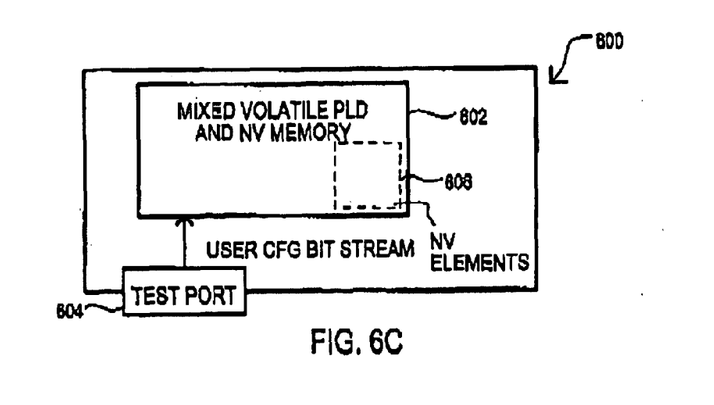

The particular example of FIG. 6 also includes a test port 604.

In one arrangement, a mixed volatile/nonvolatile device 602 may be fabricated with a process that is capable of forming both volatile logic circuits and re-programmable nonvolatile circuits. This is in contrast to particular versions of the second embodiment, which include a mask PROM that is not re-programmable. Such an arrangement can allow for a more compact overall assembly 600 than the first and second embodiments previously described. In particular, first and second embodiments may include a PLD and nonvolatile memory formed on different dice. Consequently, such arrangements may include additional circuit board and/or multichip module wiring.

A mixed volatile/nonvolatile device 602 may take a variety of forms. As but one example, re-programmable nonvolatile circuits may include a nonvolatile memory cell array "embedded" within an associated volatile PLD. As another example, nonvolatile circuits may be distributed within volatile logic circuits. More particularly, some programmable logic approaches include unit cells with both volatile and nonvolatile circuit elements. Nonvolatile elements are diagrammatically represented in FIGS. 6A to 6C by a dashed area 606. Of course, as noted above, because nonvolatile elements may take a variety of forms, such a representation should not be construed as limiting to the present invention.

A third embodiment 600 may undergo a self-test and be configured in the same general fashion as the method shown in FIG. 3. However, because a programmable logic and re-programmable nonvolatile logic can be formed on a single die, a step 302 may not be included.

In a third embodiment 600, BIST data can be programmed into nonvolatile elements of a mixed volatile/nonvolatile device 602. Such a programming step may occur at various points in a manufacturing process. As one example, BIST data can be programmed before a die containing a mixed volatile/nonvolatile device 602 is packaged. As another example, if a test port 604 is not integrated with a mixed volatile/nonvolatile device 602, BIST data may be programmed after a packaging step through test port 604. Such a programming step may occur in the same general fashion as described with reference to a first embodiment of FIGS. 2A to 2C. In particular, a mixed volatile/nonvolatile device 602 may include circuitry for decompressing a compressed bit stream.

FIG. 6B shows stored BIST data being provided from nonvolatile elements to volatile circuit elements, both of which are within a mixed volatile/nonvolatile device 602. In this way, a mixed volatile/nonvolatile section 602 can be configured for a self-test. In one arrangement, such BIST data can be provided upon power-up. In alternate arrangements, one or a number of tests can be initiated by any of a number of methods, including those described in conjunction with the other embodiments (command entry, overvoltage signals, etc.). In addition, as noted in conjunction with other embodiments, BIST data could be provided to a another PLD (which may be a volatile PLD or a mixed volatile/nonvolatile PLD) or to another non volatile memory.

FIG. 6B also shows a self-test result data that may be provided from a mixed volatile/nonvolatile device 602. Such self-test result data can indicate if a self-test is passed or failed. If data indicates a failed self-test, an error indication or the like can be provided. However, if data indicates a self-test is passed, a third embodiment 600 may then be used in a conventional fashion.

As shown in FIG. 6C, having established that programmable logic has passed a self-test, a user may program the programmable logic device with desired configuration data. In one embodiment, such an operation may overwrite all or a portion of the previously programmed BIST data.

In this way, a third embodiment 600 may include a mixed volatile/nonvolatile device 602 that can provide BIST capabilities without necessarily increasing the overall size of an assembly 600. A third embodiment 600 may be more compact than a first or second embodiment, as a separate nonvolatile memory (such as 102 and 202) is not necessarily included.

As noted above, alternate embodiments could include more than one self-test. FIGS. 7A-7D illustrate a fourth embodiment that can include multiple tests and multiple nonvolatile memory sectors having different properties.

A fourth embodiment 700 may include a nonvolatile memory 702, a volatile PLD 704, and a test port 706. A nonvolatile memory 702 may include multiple sectors. two of which are shown as 708-0 and 708-1. Sectors (708-0 and 708-1) may have different properties. In particular, such sectors may be separately erasable and one may be a "boot" sector. Boot sectors are well understood in the art any may include various protection features that prevent boot data from being erased and/or overwritten.

In the example of FIGS. 7A to 7D it will be assumed that sector 708-0 may be a boot sector that includes BIST data for a particular test BIST0. Sector 708-1 may be a non-boot sector that includes BIST data for a second test BIST1. Such an arrangement may be advantageous when the frequency of test are different. For example, a test BIST1 may be a test that is performed once or only a few times, while test BIST0 may be a basic functional test that can be performed more many times throughout the life of the device. More particularly, a BIST1 test could be used to quantify the operation of a fourth embodiment (i.e., provide a speed rating etc.), while a BIST0 test may be a functional self-test that could be periodically performed, either upon power-up, or at various times while in a system.

Figure 7A:
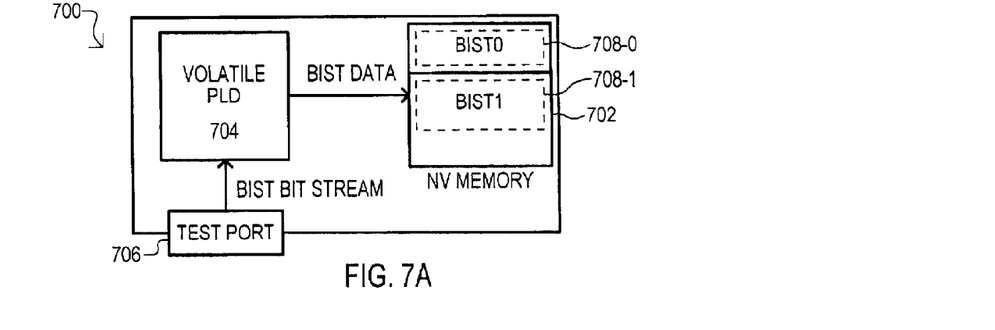
FIGS. 7A to 7D are block diagrams showing a programmable logic device according to a fourth embodiment.

A fourth embodiment 700 may follow the general method shown in FIG. 3. However, due to the multiple test capability some steps may vary. In particular, as shown in FIG. 7A, programming a nonvolatile memory with BIST data (step 304) may include programming BIST0 and BIST1 data. Further, because BIST0 is in a boot sector, particular access procedures may have to be executed to access this sector. That is, in some arrangements programming sector 708-0 may require more and/or different steps than programming sector 708-1. As noted in conjunction with other embodiments, a nonvolatile memory 702 may be programmed through a volatile PLD 704 or directly by way of a port, such as test port 706.

Figure 7B:
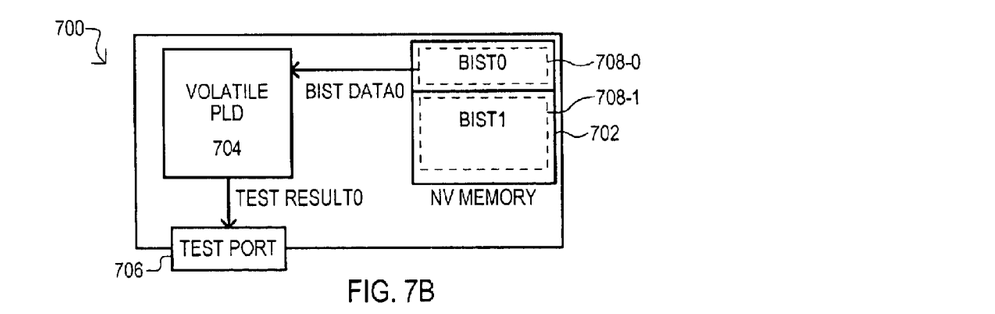
Figure 7C:
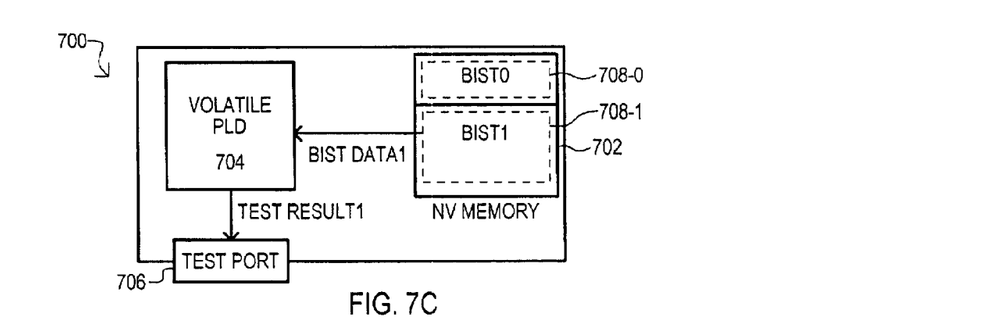

Executing a self-test (step 308) may also be different. As shown in FIGS. 7B and 7C and as noted above, a BIST0 test may be performed at different times than a BIST1 test.

Figure 7D:
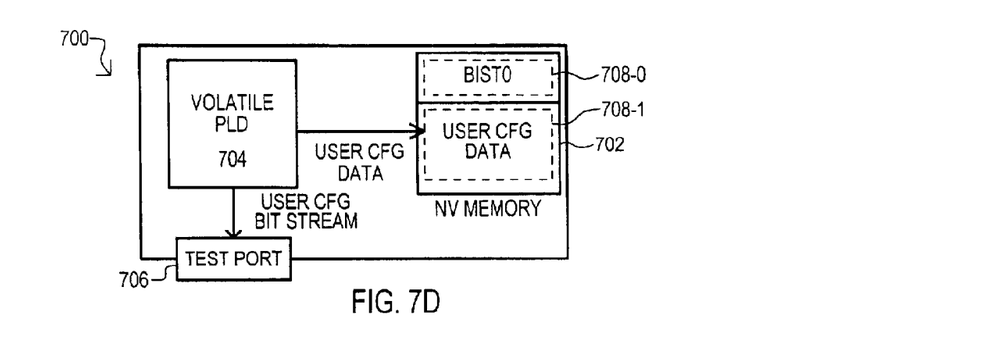

Programming a nonvolatile memory with user configuration data (step 314) may also vary from previous embodiments. As but one example, because sector 708-0 may be a boot sector, such a sector may be protected from being erased or overwritten with user data. Thus, user data may be programmed into non-protected sector 708-1, overwriting the BIST1 data but preserving the BIST0 data. User data may be programmed in the same general fashion as BIST data.

Of course, while a boot sector can provide greater protection for BIST0 test data, alternate embodiments could include different non-protected sectors and a user may be instructed not to write into a sector storing BIST0 test data.

A fourth embodiment 700 may be configured to automatically load configuration data from one sector and then from another, to advantageously execute a self-test. More particularly, in a fourth embodiment, upon boot up, a volatile PLD 702 can automatically store BIST0 test data by loading from a base address of sector 708-0. A BIST0 self-test may then be executed. Subsequently, a volatile PLD 702 may then load from the base address of sector 708-1. If sector 708-1 stores BIST1 data, a BIST1 self-test may then be executed. If sector 708-1 stores user configuration data, a volatile PLD 704 can be configured for use.

In this way, multiple nonvolatile sectors can provide different areas for storing different tests, and may be configured to store both user data and a self-test data. In one particular embodiment, one or more self-tests may be preserved in a protected sector for use at various times during the lifetime of the device.

In other operations, BIST data for one or more self-tests could be provided to other PLDs or to other nonvolatile memories.

It is understood that while particular nonvolatile structures have been described (i.e., EEPROMs and PROMs), other nonvolatile elements could be used in alternate embodiments, including but not limited to ferroelectric random access memories (FRAMs) and "anti-fuse" technology.

Thus, it is understood that while the various particular embodiments have been set forth herein, methods and structures according to the present invention could be subject to various changes, substitutions, and alterations without departing from the spirit and scope of the invention. Accordingly, the present invention is intended to be limited only as defined by the appended claims.

What is claimed is:

1. A programmable logic device assembly, comprising:

a programmable logic circuit that provides functions according to configuration data including a self-test function; and at least one nonvolatile store of the programmable logic device assembly coupled to the programmable logic circuit that provides self-test configuration data for the programmable logic circuit and subsequently stores user configuration data.

2. The programmable logic device assembly of claim 1, wherein:

the programmable logic circuit provides a self-test result when configured for self-test function.

3. The programmable logic device assembly of claim 2, further including:

a test port for providing the self-test result in a predetermined format.

4. The programmable logic device assembly of claim 1, wherein:

the at least one nonvolatile store includes a first nonvolatile store formed with the programmable logic circuit on a single integrated circuit die.

5. The programmable logic device assembly of claim 4, wherein:

the first nonvolatile store includes re-programmable nonvolatile circuit elements.

6. The programmable logic device assembly of claim 5, wherein:

the first nonvolatile store includes electrically erasable programmable read-only-memory cells.

7. The programmable logic device assembly of claim 4, wherein:

the self-test configuration data in the at least one nonvolatile store is set by at least one manufacturing process step for the programmable logic device assembly.

8. The programmable logic device assembly of claim 7, wherein:

the at least one nonvolatile store includes a mask programmable read-only-memory that stores self-test configuration data and a separate nonvolatile memory that can store user configuration data.

9. The programmable logic device assembly of claim 1, wherein:

the at least one nonvolatile store includes at least two sectors and self-test configuration data is stored in a first sector.

10. The programmable logic device assembly of claim 9, wherein:

the first sector is a boot sector.

11. A method, comprising the steps of:

performing a self-test on a programmable logic circuit of one package according to self-test configuration data in a self-test nonvolatile store of the one package; and storing user configuration data in a user nonvolatile store if the programmable logic circuit passes the self-test.

12. The method of claim 11, wherein:

the self-test nonvolatile store is the same as the user nonvolatile store.

13. Tho method of claim 12, wherein:

storing user configuration data includes programming user configuration data in locations that stored self-test configuration data.

14. The method of claim 12, wherein:

storing user configuration data includes storing user configuration data in locations that are different than those that store self-test configuration data.

15. The method of claim 11, further including:

forming the self-test nonvolatile store on the same die as the programmable logic circuit.

16. The method of claim 11, further including:

assembling the programmable logic circuit on one die with the nonvolatile store on another die into the one package.

17. The programmable logic circuit of claim 16, wherein:

the one package is a multi-chip module.

18. A programmable logic assembly self-test method, comprising the steps of:

storing self-test information in a first nonvolatile store of the assembly that places a programmable logic circuit of the assembly into a self-test configuration;

executing a self-test on the programmable logic circuit; and providing user configuration information that places the programmable logic circuit in a user configuration.

19. The method of claim 18, wherein:

the user configuration data is stored in the first nonvolatile store.

20. The method of claim 18, wherein:

the user configuration data is stored in a second nonvolatile store that is different than the first nonvolatile store.

* * * * *